United States Patent
Park et al.

(10) Patent No.: US 11,476,281 B2
(45) Date of Patent: Oct. 18, 2022

(54) TRANSISTOR AND ELECTRONIC DEVICE

(71) Applicant: LG Display Co., Ltd., Seoul (KR)

(72) Inventors: SeHee Park, Seoul (KR); JungSeok Seo, Daejeon (KR); Jaeyoon Park, Gyeonggi-do (KR); PilSang Yun, Gyeonggi-do (KR); Jiyong Noh, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 152 days.

(21) Appl. No.: 16/521,906

(22) Filed: Jul. 25, 2019

(65) Prior Publication Data

US 2020/0135771 A1   Apr. 30, 2020

(30) Foreign Application Priority Data

Oct. 25, 2018   (KR) .................. 10-2018-0128525

(51) Int. Cl.
*H01L 27/12*       (2006.01)
*H01L 29/22*       (2006.01)

(52) U.S. Cl.
CPC ...... *H01L 27/1225* (2013.01); *H01L 27/1229* (2013.01); *H01L 29/2206* (2013.01)

(58) Field of Classification Search
CPC ............. H01L 27/1225; H01L 29/2206; H01L 27/1229; H01L 29/78669; H01L 29/78678; H01L 27/1248; H01L 29/458; H01L 29/45; H01L 29/7869; H01L 29/41733; H01L 29/78618; H01L 29/78606; H01L 29/42384; H01L 27/3262; H01L 21/0228; H01L 21/0262; H01L 27/1214; G02F 1/1368
See application file for complete search history.

(56) References Cited

U.S. PATENT DOCUMENTS

| | | | |
|---|---|---|---|
| 2013/0214269 A1* | 8/2013 | Wang | H01L 29/78693 257/43 |
| 2015/0287752 A1* | 10/2015 | Yeo | H01L 29/66969 257/43 |
| 2017/0092178 A1* | 3/2017 | Lee | G09G 3/2018 |
| 2017/0162672 A1* | 6/2017 | Hutin | H01L 29/66643 |
| 2018/0097076 A1* | 4/2018 | Cheng | H01L 29/66484 |

* cited by examiner

*Primary Examiner* — Benjamin Tzu-Hung Liu
(74) *Attorney, Agent, or Firm* — Morgan Lewis & Bockius LLP

(57) ABSTRACT

An electronic device comprises a panel, a driving circuit configured to drive the panel, and a transistor disposed in the panel. The transistor includes a first insulation film on a substrate, an active layer disposed on the first insulation film, a second insulation film disposed on the active layer and the first insulation film to cover the active layer, the second insulation film having a thickness smaller than a thickness of the first insulation film, a source electrode disposed on the second insulation film and spaced apart from the active layer by the second insulation film, the source electrode overlapping an end of the active layer, and a drain electrode disposed on the second insulation film and spaced apart from the active layer by the second insulation film, the drain electrode overlapping another end of the active layer.

22 Claims, 15 Drawing Sheets

Process Flow

TRANSISTOR AND ELECTRONIC DEVICE

CROSS REFERENCE TO RELATED APPLICATIONS

This application claims priority to Korean Patent Application No. 10-2018-0128525, filed in Korea on Oct. 25, 2018, which is hereby incorporated by reference for all purposes as if fully set forth herein.

BACKGROUND

Technical Field

The present disclosure relates to a transistor and electronic device.

Discussion of the Related Art

As the information society develops, the demand for various forms of electronic devices such as display devices and lighting devices increases. An example of such an electronic device may include a panel in which data lines and gate lines are arranged, a data driver for driving the data lines, and a gate driver for driving the gate lines.

In the panel, a large number of transistors may be arranged for driving various functions of the panel. Accordingly, the process for manufacturing the panel may be complicated and difficult. If the panel is manufactured by a convenient and/or easy process, the performance of the transistors may deteriorate. Alternatively, if it is attempted to increase the performance of a transistor or to repair a structural defect, the panel structure with such transistors may be more complicated, and the panel manufacturing process may become even more complicated and difficult.

SUMMARY

Accordingly, the present disclosure is directed to a transistor and electronic device that substantially obviate one or more of the problems due to limitations and disadvantages of the related art.

An aspect of embodiments of the present disclosure is to provide a transistor and an electronic device having a structure capable of reducing the number of mask processes.

Another aspect of embodiments of the present disclosure is to provide a transistor and an electronic device in which an active layer and a source/drain electrode are spaced apart from each other without an etch stopper structure, so that the electronic device may have excellent device performance without back channel damage.

Another aspect of embodiments of the present disclosure is to provide a transistor and an electronic device having a short channel and enabling miniaturization of the transistor.

Another aspect of embodiments of the present disclosure is to provide a transistor and an electronic device having a structure for reducing unnecessary parasitic capacitance.

Another aspect of embodiments of the present disclosure is to provide a transistor and an electronic device which enable excellent process convenience, channel damage prevention, a short channel, and device miniaturization.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

To achieve these and other advantages and in accordance with the purpose of the present invention, as embodied and broadly described, an electronic device includes a panel and a driving circuit for driving the panel.

In accordance with an aspect of the present disclosure, there is provided an electronic device comprising a panel; a driving circuit configured to drive the panel; and a transistor disposed in the panel, wherein the transistor includes: a first insulation film on a substrate; an active layer disposed on the first insulation film; a second insulation film disposed on the active layer and the first insulation film to cover the active layer, the second insulation film having a thickness smaller than a thickness of the first insulation film; a source electrode disposed on the second insulation film and spaced apart from the active layer by the second insulation film, the source electrode overlapping an end of the active layer; and a drain electrode disposed on the second insulation film and spaced apart from the active layer by the second insulation film, the drain electrode overlapping another end of the active layer.

The source electrode and the drain electrode may be separated from the active layer by the second insulation film and may be not directly contacted with active layer.

The second insulation film may be formed by a thin film deposition method capable of thin film deposition control such as MOCVD (Metal-Organic Chemical Vapor Deposition) or ALD (Atomic Layer Deposition).

The second insulation film may be entirely deposited.

The active layer may be composed of an amorphous silicon semiconductor, a poly-silicon semiconductor, or an oxide semiconductor or the like.

The first insulation film and the second insulation film may be made of the same material.

The first insulation film and the second insulation film may be made of different materials.

The first insulation film and the second insulation film may be formed of an oxide insulation film. In this case, the oxygen content of the second insulation film may be different from the oxygen content of the first insulation film.

The first insulation film and the second insulation film may be formed of an oxide insulation film. In this case, the oxygen content of the second insulation film may be higher than the oxygen content of the first insulation film.

The second insulation film may have a thickness smaller than that of the first insulation film, and may have a thickness of 50 Å or less.

The second insulation film may have a smaller thickness deviation than the first insulation film.

The second insulation film may have a higher density than the first insulation film.

The second insulation film may be disposed over the entire active area of the panel.

The second insulation film may be extended to the non-active area which is an outer area of the active area.

A transistor may be disposed in an area of each of a plurality of subpixels in an active area of the panel.

The transistor may be included in a gate driving circuit disposed in the non-active area which is an outer area of the active area of the panel.

The transistor may have a top gate structure or a bottom gate structure.

In the case that the transistor has the bottom gate structure, the gate electrode may be disposed between the substrate and the first insulation film.

In the case that the transistor is disposed in the active area, the passivation layer may be disposed to cover the source electrode and the drain electrode. A pixel electrode may be disposed on the passivation layer and the pixel electrode may be electrically connected to the source electrode or the drain electrode through a hole in the passivation layer.

In the case that the transistor has a top gate structure, a third insulation film may be disposed to cover the source electrode and the drain electrode. In this case, the gate electrode may be disposed on the third insulation film.

In the case that the transistor is disposed in the active area, the passivation layer may be disposed to cover the gate electrode. A pixel electrode may be disposed on the passivation layer and the pixel electrode may be electrically connected to the source electrode or the drain electrode through a hole in the third insulation film.

The panel may be an organic light emitting display panel (OLED panel) or a liquid crystal display panel (LCD panel).

A data voltage may be applied to the gate electrode.

Alternatively, a data voltage may be applied to the pixel electrode.

In accordance with another aspect of the present disclosure, there is provided a transistor comprising a first insulation film on a substrate; an active layer disposed on the first insulation film; a second insulation film disposed on the active layer and the first insulation film to cover the active layer and having a thickness smaller than a thickness of the first insulation film; a source electrode disposed on the second insulation film and spaced apart from the active layer by the second insulation film, the source electrode overlapping an end of the active layer; and a drain electrode disposed on the second insulation film and spaced apart from the active layer by the second insulation film, the drain electrode overlapping with another end of the active layer.

The transistor may further include a gate electrode disposed under the active layer.

Alternatively, the transistor may further include a gate electrode located above the active layer.

According to embodiments of the present disclosure, there may be provided a transistor and an electronic device having a structure capable of reducing the number of mask processes.

According to embodiments of the present disclosure, it may be possible to provide a transistor and an electronic device having an active layer and a source/drain electrode spaced apart from each other without etch stopper configuration, thereby providing an electronic device free from back channel damage and having excellent device performance.

According to embodiments of the present disclosure, it may possible to provide a transistor and an electronic device capable of easily implementing a short channel structure and realizing a small-size transistor.

According to embodiments of the present disclosure, it may be possible to provide a transistor and an electronic device having a structure for reducing unnecessary parasitic capacitance.

According to embodiments of the present disclosure, it may be possible to provide a transistor and an electronic device capable of excellent panel manufacturing process convenience, prevention of channel damage, short channel implementation, and device miniaturization.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
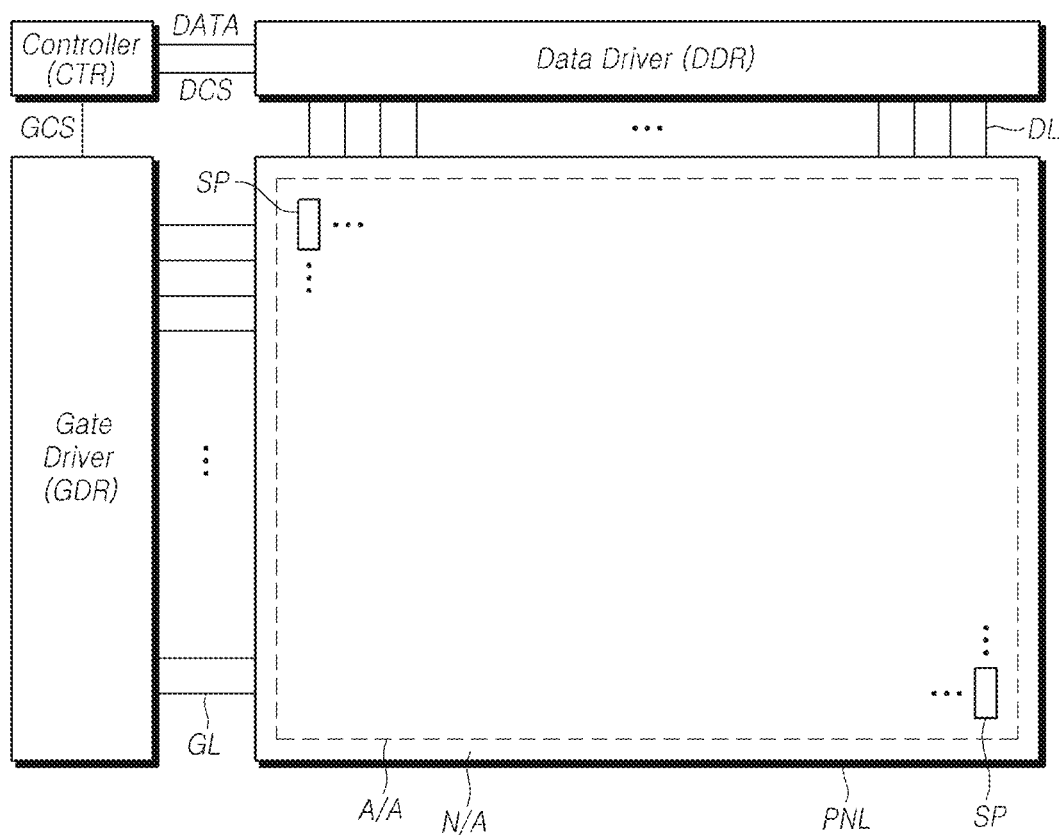
FIG. 1 is a schematic system configuration diagram of an electronic device according to embodiments of the present disclosure.

Reference will now be made in detail to embodiments of the present disclosure, examples of which are illustrated in the accompanying drawings.

In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to," "is coupled to," or "is in contact with" another structural element, it should be interpreted that another structural element may "be connected to," "be coupled to," or "be in contact with" the structural elements as well as that the certain structural element is directly connected to or is in direct contact with another structural element.

FIG. 1 is a schematic system configuration diagram of an electronic device according to embodiments of the present disclosure.

The electronic device according to embodiments of the present disclosure may include a display device, a lighting device, a light emitting device, and the like. Hereinafter, for convenience of explanation, the display device will be mainly described as the representative example of electronic device. However, the present disclosure may be similarly applied to various other types of the electronic devices such as the lighting device and the light emitting device as long as it includes a transistor according to embodiments of the present disclosure.

The electronic device according to embodiments of the present disclosure may include a panel (PNL) for displaying an image or outputting light, and a driving circuit for driving the panel (PNL).

The panel (PNL) may include a plurality of data lines (DL), a plurality of gate lines (GL), and a plurality of subpixel (SP) defined by the plurality of data lines (DL) and the plurality of gate lines (GL) and arranged in a matrix type.

In the panel (PNL), the plurality of data lines (DL) and the plurality of gate lines (GL) may be arranged to cross each other. As an example, the plurality of gate lines (GL) may be arranged in a row or a column, and the plurality of data lines (DL) may be arranged in a column or a row. Hereinafter, for convenience of explanation, it may be assumed that the plurality of gate lines (GL) are arranged in a row, and the plurality of data lines (DL) are arranged in a column.

In the panel (PNL), other types of signal lines may be arranged in addition to the plurality of data lines (DL) and the plurality of gate lines (GL), depending on the subpixel structure or the like. A driving voltage line, a reference voltage line, a common voltage line, or the like may be further disposed.

The panel (PNL) may be various types of panels such as the LCD (Liquid Crystal Display) panel, the OLED (Organic Light Emitting Diode) panel and the like.

The types of signal lines arranged in the panel (PNL) may vary depending on the subpixel structure, the panel type (e.g., LCD panel, OLED panel, etc.) and the like. In this specification, a signal line may be a concept including the electrode to which a signal is applied.

The panel (PNL) may include an active area (A/A) in which an image is displayed, and a non-active area (N/A) in which the image is not displayed. Here, the non-active area (N/A) may be also referred to as a bezel area.

A plurality of subpixels (SP) for displaying the image may be arranged in the active area (A/A)

A pad portion for electrically connecting to the data driver (DDR) may be disposed in the non-active area (N/A) as well as a plurality of data link lines for connecting the pad portion to the plurality of data lines (DL). Here, the plurality of data link lines may be portions extending from the plurality of data lines (DL) to the non-active region (N/A) or may be separate patterns electrically connected to the plurality of data lines (DL).

In addition, the gate drive-related lines for transferring a voltage (signal) required for gate driving to the gate driver (GDR) through the pad portion electrically connected to the data driver (DDR) may be arranged in the non-active area (N/A). For example, the gate drive-related lines may include clock lines for transferring clock signals, gate voltage lines for transferring gate voltages (VGH, VGL), gate drive control signal lines for transferring various control signals required for generating scan signals, and the like. These gate drive-related lines may be arranged in the non-active area (N/A), unlike the gate lines (GL) arranged in the active area (A/A).

The driving circuit may include the data driver (DDR) for driving the plurality of data lines (DL), the gate driver (GDR) for driving the plurality of gate lines (GL), and a controller (CTR) for controlling the data driver (DDR) and the gate driver (GDR).

The data driver (DDR) may drive the plurality of data lines (DL) by outputting the data voltage to the plurality of data lines (DL).

The gate driver (GDR) may drive the plurality of gate lines (GL) by outputting the scan signals to the plurality of gate lines (GL).

The controller (CTR) may supply various types of control signals (DCS, GCS) for the driving operation of the data driver (DDR) and the gate driver (GDR) to control such operation. Furthermore, the controller (CTR) may supply the image data (DATA) to the data driver (DDR).

The controller CTR may start scanning in accordance with the timing implemented in each frame, may convert the image data inputted from the outside according to the data signal format used in the data driver (DDR), and may output the converted image data (DATA), so that it may control the data driving operation at a suitable time according to the scanning.

The controller (CTR) may receive the timing signals including a vertical synchronization signal (Vsync), a horizontal synchronization signal (Hsync), an input data enable signal (DE), a clock signal (CLK) and the like from an external device (e.g., a host system), may generate various control signals, and may output the generated control signals to the data driver (DDR) and the gate driver (GDR) in order to control the data driver (DDR) and the gate driver (GDR).

For example, in order to control the gate driver (GDR), the controller (CTR) may output various gate control signals (GCS) including a gate start pulse (GSP), a gate shift clock (GSC), a gate output enable signal (GOE) and the like.

In addition, in order to control the data driver (DDR), the controller (CTR) may output various data control signals (DCS) including a source start pulse (SSP), a source sampling clock (SSC), a source output enable signal (SOE) and the like.

The controller (CTR) may be a timing controller used in a general display device, or may be a controller capable of further performing other control functions including a timing control.

The controller (CTR) may be implemented as a separate component from the data driver (DDR), or may be implemented an integrated circuit integrated with the data driver (DDR).

The data driver (DDR) may receive the image data (DATA) from the controller (CTR) and may supply the data voltages to the plurality of data lines (DL) to drive the plurality of data lines (DL). The data driver (DDR) may be also referred to as a source driver.

The data driver (DDR) may exchange various signals with the controller (CTR) through various types of interfaces.

The gate driver (GDR) may sequentially drive the plurality of gate lines (GL) by sequentially providing scan signals to the plurality of gate lines (GL). The gate driver (GDR) may be also referred to as a scan driver.

The gate driver (GDR) sequentially provides the scan signal having an ON voltage or an OFF voltage to the plurality of gate lines (GL) in accordance with the control of the controller (CTR). When a specific gate line is opened by the gate driver (GDR), the data driver (DDR) converts the image data (DATA) received from the controller (CTR) into the data voltage of an analog form and provides the data voltage to the a plurality of data lines (DL).

The data driver (DDR) may be located only on one side (for example, on the upper side or the lower side) of the panel (PNL) or may be located on both sides (for example, on the upper side and the lower side) of the panel (PNL) depending on the driving method and the panel designing method. Furthermore, the gate driver (GDR) may be located only on one side (for example, the left side or the right side) of the panel (PNL) or may be located on both sides (for example, the left side and the right side) of the panel (PNL) depending on the driving method and the panel designing method.

The data driver (DDR) may be implemented including one or more source driver integrated circuits (SDICs). Each of the source driver integrated circuits (SDIC) may include a shift register, a latch circuit, a digital to analog converter (DAC), an output buffer and the like. The data driver (DDR) may further include one or more analog to digital converters (ADCs).

Each source driver integrated circuit (SDIC) may be connected to a bonding pad of a panel (PNL) in a TAB (Tape Automated Bonding) type or a COG (Chip On Glass) type, or may be disposed directly on the panel (PNL). In some cases, each source driver integrated circuit (SDIC) may be integrated and disposed on the panel (PNL). In addition, each source driver integrated circuit (SDIC) may be implemented as a COF (Chip On Film) type. In this case, each source driver integrated circuit (SDIC) may be mounted on a circuit film and may be electrically connected to the data lines (DL) in the panel (PNL) through the circuit film.

The gate driver (GDR) may include a plurality of gate drive circuits (GDC). The plurality of gate drive circuits (GDC) may correspond to each of the plurality of gate lines (GL), respectively.

Each gate drive circuit (GDC) may include a shift register, a level shifter and the like. Each gate drive circuit (GDC) may be connected to the bonding pad of the panel (PNL) in the form of a TAB (Tape Automated Bonding) type or a COG (Chip On Glass) type. In addition, each gate drive circuit (GDC) may be implemented by the COF (Chip On Film) method. In this case, each gate drive circuit (GDC) may be mounted on the circuit film and may be electrically connected to the gate lines (GL) in the panel PNL through the circuit film. In addition, each gate drive circuit (GDC) may be implemented as the GIP (Gate In Panel) type and may be incorporated in the panel (PNL). That is, each gate drive circuit (GDC) may be formed directly on the panel (PNL).

Figure 2:
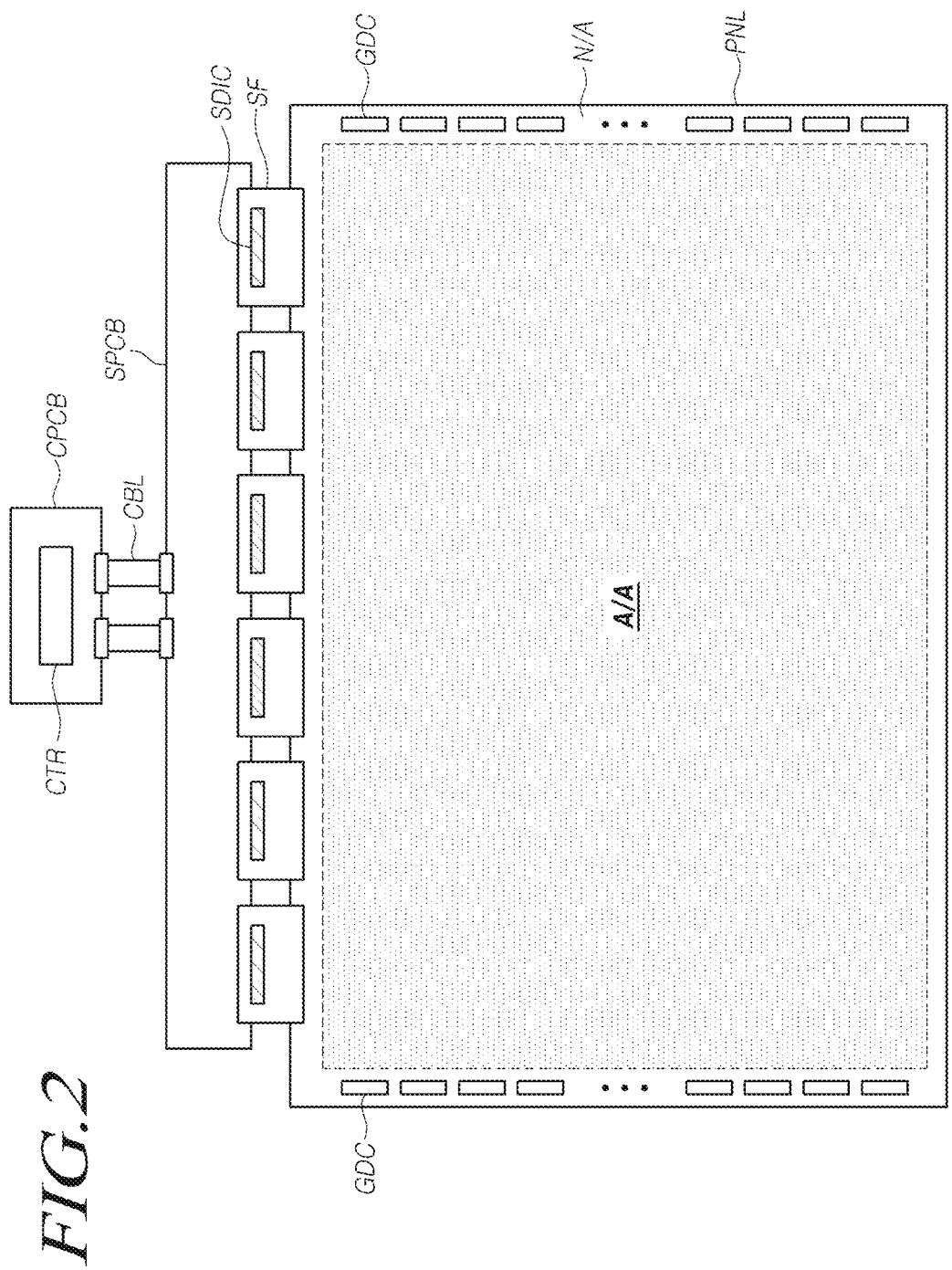
FIG. 2 illustrates an example of system including an electronic device according to embodiments of the present disclosure.

FIG. 2 illustrates an example of a system including the electronic device according to embodiments of the present disclosure. With reference to FIG. 2, in the electronic device according to embodiments of the present disclosure, the data driver (DDR) is implemented as the COF (Chip On Film) type among various types (TAB, COG, COF, etc.), and the gate driver (GDR) is implemented as the GIP (Gate In Panel) type among various types (TAB, COG, COF, GIP, etc.).

The data driver (DDR) may be implemented with one or more source driver integrated circuits (SDIC). FIG. 2 illustrates the example in which the data driver (DDR) is implemented in a number of source driver integrated circuits (SDICs).

In the case that the data driver (DDR) is implemented as the COF type, each source driver integrated circuit (SDIC) implementing the data driver (DDR) may be mounted on the source-side circuit film (SF). One side of the source-side circuit film (SF) may be electrically connected to a pad portion (a group of pads) existing in the non-active area (N/A) of the panel (PNL). A plurality of lines for electrically connecting the source driver integrated circuit (SDIC) and the panel (PNL) may be disposed on the source-side circuit film (SF).

The electronic device according to embodiments may include at least one source printed circuit board (SPCB) for circuit connection between a plurality of source driver integrated circuits (SDIC) and other devices, and a control printed circuit board (CPCB) for mounting control components and various electrical devices.

At least one source printed circuit board (SPCB) may be connected to the other side of the source-side circuit film (SF) on which the source driver IC (SDIC) is mounted. That is, one side of the source-side circuit film (SF) mounting the source driver integrated circuit (SDIC) may be electrically connected to the non-active area (N/A) of the panel (PNL), and the other side of the source-side circuit film (SF) may be electrically connected to the source printed circuit board (SPCB).

The controller (CTR) for controlling operations of the data driver (DDR) and the gate driver (GDR) may be disposed on the control printed circuit board (CPCB). In addition, the control printed circuit board CPCB may be provided with a power management integrated circuit (PMIC) for supplying various voltages or currents to the panel (PNL), the data driver (DDR), and the gate driver (GDR), and for controlling voltages or currents supplied to the panel (PNL), the data driver (DDR) and the gate driver (GDR).

The source printed circuit board (SPCB) and the control printed circuit board (CPCB) may be connected in a circuit through at least one connecting member (CBL). The connecting member (CBL) may be, for example, a flexible printed circuit (FPC), a flexible flat cable (FFC) or the like. One or more source printed circuit boards (SPCBs) and control printed circuit boards (CPCBs) may be implemented by being integrated into one printed circuit board.

In the case that the gate driver (GDR) is implemented as the GIP (Gate In Panel) type, the plurality of gate drive circuits (GDC) included in the gate driver (GDR) may be formed directly on the non-active area (N/A) of the panel (PNL).

Each of the plurality of gate drive circuits (GDC) may output the scan signal (SCAN) to the corresponding gate line (GL) disposed in the active area (A/A) of the panel (PNL).

A plurality of gate drive circuits (GDC) disposed on the panel (PNL) may receive various signals for generating the scan signal including a clock signal, a high level gate voltage (VGH), a low level gate voltage (VGL), a start signal (VST), a reset signal (RST) and the like through the gate drive-related lines disposed in the non-active area (N/A). The gate drive-related lines disposed in the non-active area (N/A) may be electrically connected to the source-side circuit film (SF) disposed closest to the plurality of gate drive circuits (GDC).

Figure 3:
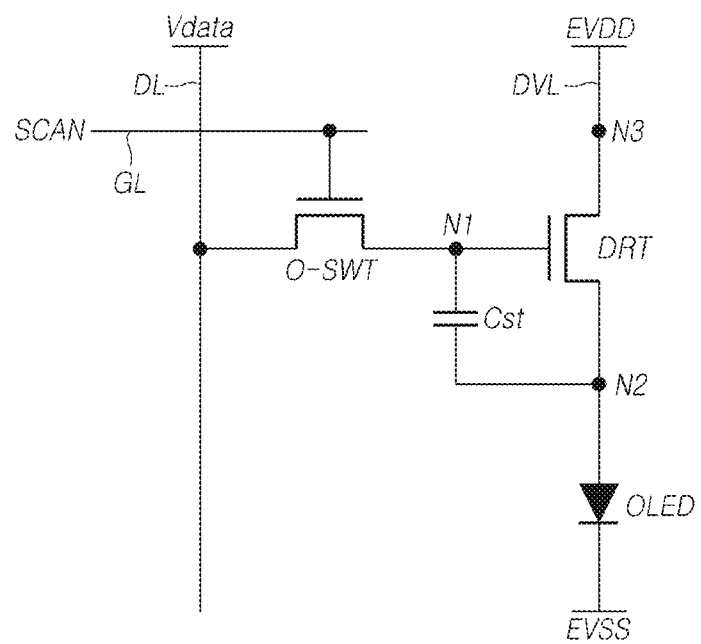
FIG. 3 illustrates a subpixel including a third type of transistor according to embodiments of the present disclosure for an organic light emitting diode panel (OLED panel)

FIG. 3 is a diagram illustrating the structure of a subpixel (SP) in the case that the panel (PNL) according to embodiments of the present disclosure is an OLED (Organic Light Emitting Diode) panel.

With reference to FIG. 3, each subpixel (SP) in the panel 110 as the OLED panel may include an organic light emitting diode (OLED), a driving transistor (DRT) for driving the organic light emitting diode (OLED), a switching transistor (O-SWT) electrically connected between the first node N1 of the driving transistor (DRT) and the corresponding data line (DL), and a storage capacitor (Cst) electrically connected between the first node N1 and the second node N2 of the driving transistor (DRT).

The organic light emitting diode (OLED) may include an anode electrode, an organic light emitting layer, a cathode electrode and the like. In accordance with the circuit of FIG. 3, the anode electrode (also referred to as a pixel electrode) of the organic light emitting diode (OLED) may be electrically connected to the second node N2 of the driving transistor (DRT). A base voltage (EVSS) may be applied to the cathode electrode (also referred to as a common electrode) of the organic light emitting diode OLED.

The base voltage (EVSS) may be, for example, a ground voltage or a voltage higher or lower than the ground voltage. Furthermore, the base voltage (EVSS) may be varied depending on the driving state. For example, the base voltage (EVSS) during an image driving mode may be set to be different from the base voltage (EVSS) during a sensing driving mode.

The driving transistor (DRT) may drive the organic light emitting diode (OLED) by supplying the driving current to the organic light emitting diode (OLED). The driving transistor (DRT) may include the first node N1, the second node N2, the third node N3, and the like.

The first node N1 of the driving transistor (DRT) may be a gate node and may be electrically connected to a source node or a drain node of the switching transistor (O-SWT). The second node N2 of the driving transistor (DRT) may be a source node or a drain node and may be electrically connected to an anode electrode (or a cathode electrode) of the organic light emitting diode (OLED). The third node N3 of the driving transistor (DRT) may be a drain node or a source node and may be electrically connected to a driving voltage line (DVL) for supplying the driving voltage (EVDD).

The storage capacitor (Cst) may be electrically connected between the first node N1 and the second node N2 of the driving transistor (DRT) to maintain the data voltage (Vdata) corresponding to the image signal voltage or a voltage corresponding to the data voltage for one frame time period (or a predetermined time period).

The drain node or the source node of the switching transistor (O-SWT) may be electrically connected to the corresponding data line (DL), and the other of the source or drain node of the switching transistor (O-SWT) may be connected to the first node N1 of the driving transistor (DRT). The gate node of the switching transistor (O-SWT) may be electrically connected to the corresponding gate line (GL) to receive the scan signal (SCAN).

The switching transistor (O-SWT) may be controlled to be turned on and off by receiving the scan signal (SCAN) through the corresponding gate line to the gate node. The switching transistor (O-SWT) may be turned on by the scan signal (SCAN) to transfer the data voltage (Vdata) supplied from the corresponding data line (DL) to the first node N1 of the driving transistor (DRT).

Meanwhile, the storage capacitor (Cst) may be not a parasitic capacitor (for example, Cgs, Cgd) which is an internal capacitance existing between the first node N1 and the second node N2 of the driving transistor DRT, but instead may be an external capacitor intentionally designed outside the driving transistor (DRT).

Each of the driving transistor (DRT) and the switching transistor (O-SWT) may be an n-type transistor or a p-type transistor.

Each subpixel structure illustrated in FIG. 3 is a 2T (Transistor) 1C (Capacitor) structure, as an illustrative example. Therefore, the subpixel according to embodiments may further include one or more transistors and one or more capacitors in some cases. Alternatively, each of the plurality of subpixels may have the same structure, and some of the plurality of subpixels may have a different structure.

Figure 4:
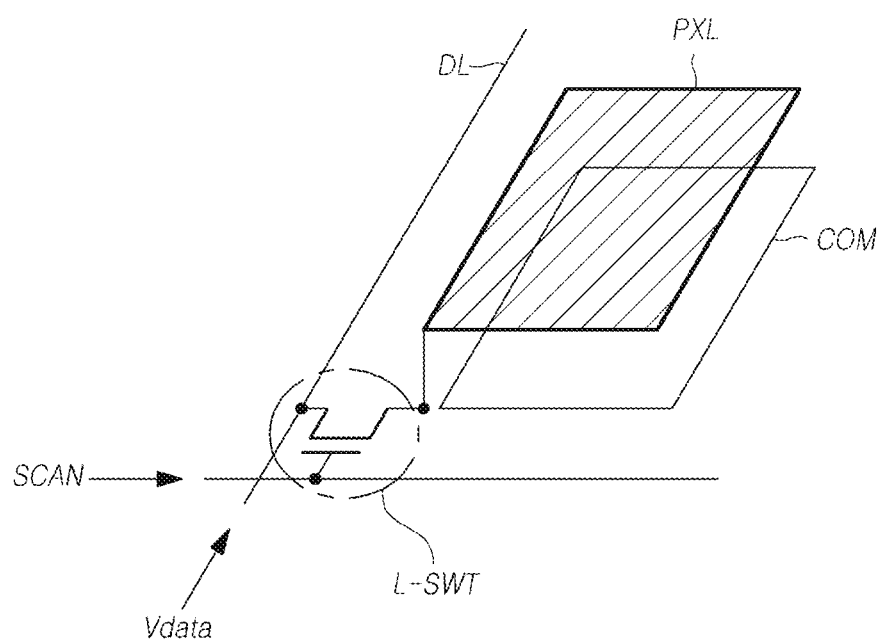
FIG. 4 illustrates a subpixel including a third type of transistor according to embodiments of the present disclosure for a liquid crystal display (LCD) panel.

FIG. 4 illustrates the structure of the subpixel (SP) in the case that the panel (PNL) according to embodiments of the present disclosure is a LCD (Liquid Crystal Display) panel. With reference to FIG. 4, each subpixel (SP) in the panel 110 as the LCD panel may include a pixel electrode (PXL), a switching transistor (L-SWT) and the like.

The switching transistor (L-SWT) may be controlled by the scan signal (SCAN) and may be electrically connected between the data line (DL) and the pixel electrode (PXL). The switching transistor (L-SWT) may be turned on by the scan signal (SCAN) to transfer the data voltage (Vdata) supplied from the data line (DL) to the pixel electrode (PXL). The pixel electrode (PXL) to which the data voltage Vdata is applied may form an electric field with the common electrode (COM) applying a common voltage. That is, a capacitor (storage capacitor) may be formed between the pixel electrode (PXL) and the common electrode (COM).

Figure 5:
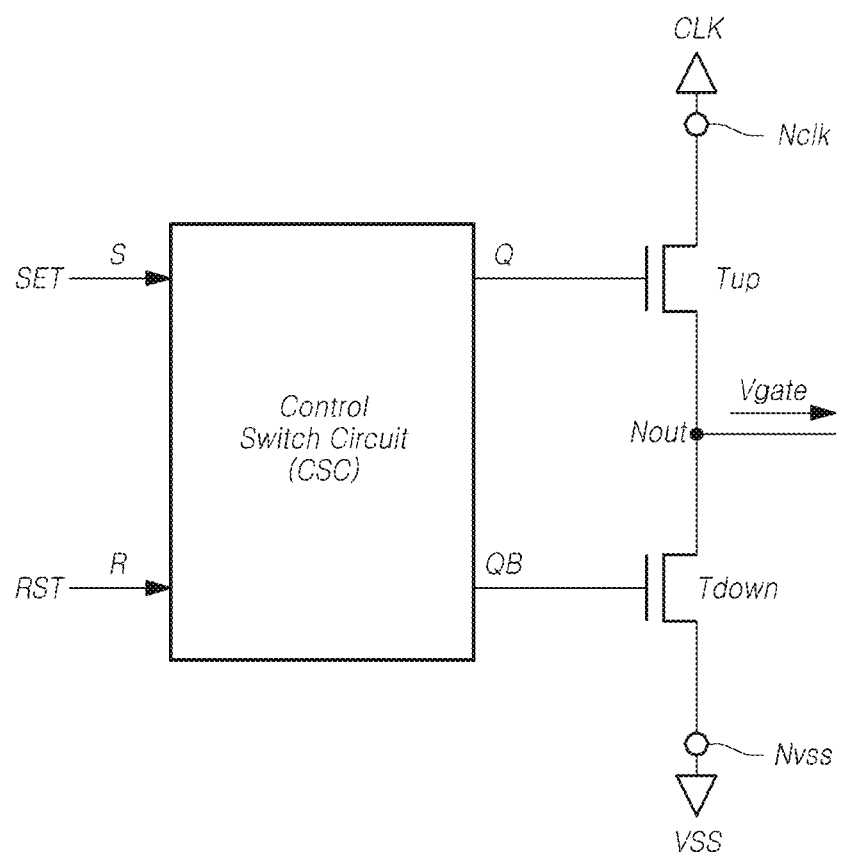
FIG. 5 is a schematic diagram illustrating a gate driving circuit incorporated in a panel according to embodiments of the present disclosure.

FIG. 5 is a schematic view of the gate drive circuit (GDC) disposed on the panel (PNL) according to embodiments of the present disclosure. With reference to FIG. 5, each gate drive circuit (GDC) may include a pull-up transistor (Tup), a pull-down transistor (Tdown) and a control switch circuit (CSC).

The control switch circuit (CSC) is a circuit for controlling the voltage of the Q node corresponding to the gate node of the pull-up transistor (Tup) and the voltage of the QB node corresponding to the gate node of the pull-down transistor (Tdown). Such a control switch circuit (CSC) may include a plurality of switches (transistors).

The pull-up transistor (Tup) is a transistor for supplying the gate signal (Vgate) corresponding to the first level voltage (for example, a high level voltage VGH) to the gate line (GL) through the gate signal output node Nout. The pull-down transistor (Tdown) is a transistor for supplying the gate signal (Vgate) corresponding to the second level voltage (for example, a low level voltage VGL) to the gate line (GL) through the gate signal output node Nout. The pull-up transistor (Tup) and the pull-down transistor (Tdown) may be turned on at different times.

The pull-up transistor (Tup) may be electrically connected between the clock signal applying node Nclk for applying the clock signal (CLK) and the gate signal output node Nout electrically connected to the gate line (GL). The pull-up transistor (Tup) may be turned on or off by the voltage of the Q node.

The gate node of the pull-up transistor (Tup) is electrically connected to the Q node. The drain node or the source node of the pull-up transistor (Tup) is electrically connected to the clock signal applying node Nclk. The other of the source node or the drain node of the pull-up transistor (Tup) is electrically connected to the gate signal output node Nout outputting the gate signal (Vgate).

The pull-up transistor (Tup) may be turned on by the voltage of the Q node and may output the gate signal (Vgate) having the high level voltage (VGH) in the high level range of the clock signal (CLK) to the gate signal output node Nout. The gate signal (Vgate) of the high level voltage (VGH) outputted from the gate signal output node Nout may be supplied to the gate line (GL).

The pull-down transistor (Tdown) may be electrically connected between the gate signal output node Nout and the base voltage node Nvss and may be turned on or off by the voltage of the QB node.

The gate node of the pull-down transistor (Tdown) may be electrically connected to the QB node. The drain node or the source node of the pull-down transistor (Tdown) is electrically connected to the base voltage node Nvss and receives a base voltage VSS corresponding to a constant voltage. The other of the source node or the drain node of the pull-down transistor (Tdown) is electrically connected to the gate signal output node Nout outputting the gate signal (Vgate).

The pull-down transistor (Tdown) may be turned on by the voltage of the QB node and may output the gate signal (Vgate) of the low level voltage (VGL) to the gate signal output node Nout. Accordingly, the gate signal (Vgate) of the low level voltage (VGL) may be supplied to the corresponding gate line (GL) through the gate signal output node Nout. Here, the gate signal (Vgate) of the low level voltage (VGL) may be, for example, the base voltage VSS.

Meanwhile, the control switch circuit (CSC) may be composed of two or more transistors, and may be provided with the nodes such as a Q node, a QB node, a set node S (also referred to as a start node), and a reset node R. In some cases, the control switch circuit (CSC) may further include an input node to which various voltages such as the driving voltage VDD are inputted.

In the control switch circuit (CSC), the Q node is electrically connected to the gate node of the pull-up transistor (Tup), and charging and discharging are repeated. Furthermore, the QB node is electrically connected to the gate node of the pull-down transistor (Tdown), and charging and discharging are repeated.

In the control switch circuit (CSC), the set node S may be applied with the set signal (SET) for instructing the start of gate driving of the gate drive circuit (GDC). The set signal (SET) applied to the set node S may be a start signal (VST) inputted from the outside of the gate driver (GDR) or may be a feedback signal (a carry signal) of the gate signal (Vgate) outputted from the gate drive circuit (GDC) of the previous stage preceding the current gate drive circuit (GD).

The reset signal (RST) applied to the reset node R in the control switch circuit (CSC) may be a reset signal for initializing the gate drive circuits GDC of all stages at the same time, or may be a carry signal input from another stage (previous or later stage).

The control switch circuit (CSC) may charge the Q node in response to the set signal (SET) and may discharge the Q node in response to the reset signal (RST). The control switch circuit (CSC) may include an inverter circuit for charging or discharging the Q node and the QB node at different timings, respectively.

As illustrated in FIG. 3, the driving transistor (DRT) and the switching transistor (O-SWT) may be arranged in each of the plurality of subpixels (SP) in the active area (A/A) of the panel (PNL) as the OLED panel.

Furthermore, as shown in FIG. 4, the switching transistor (L-SWT) may be disposed in each of a plurality of subpixels (SP) in the active area (A/A) of the panel (PNL) as the LCD panel.

In this way, a plurality of transistors (DRT, O-SWT, L-SWT) may be disposed in regions of a plurality of subpixels (SP) in the active region (A/A) of the panel (PNL) which may be the OLED panel or the LCD panel.

As shown in FIG. 2, in the case that the gate drive circuit (GDC) is implemented as the GIP type in which the gate drive circuit (GDC) is embedded in the panel (PNL), the transistors (Tup, Tdown, and the transistors in the CSC) constituting the gate drive circuit (GDC) may be arranged in the non-active area (N/A) as the outer region of the active area (A/A) of the panel (PNL).

The structure of the transistor (TR) disposed in the active arean (A/A) or the non-active area (N/A) of the panel (PNL) will be described below.

Figure 6:
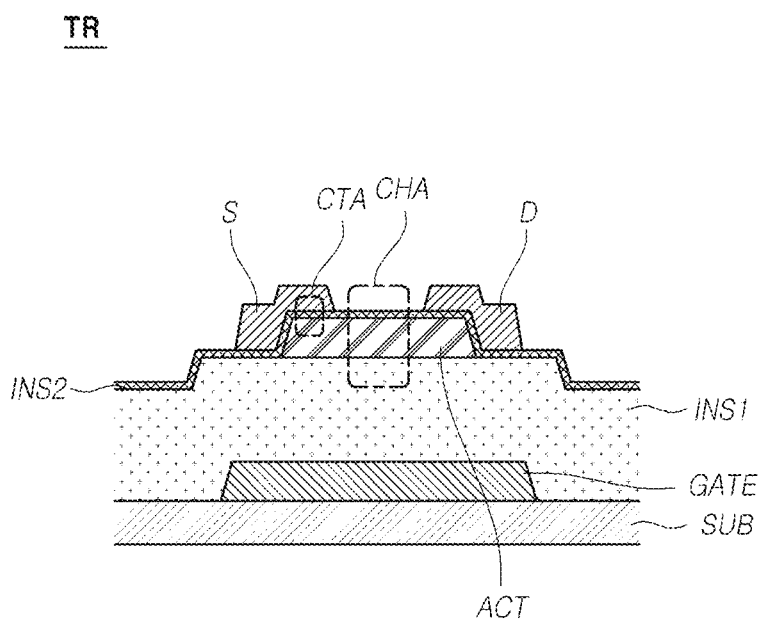
FIG. 6 is a diagram illustrating a transistor of an AES structure according to embodiments of the present disclosure.
Figure 7:
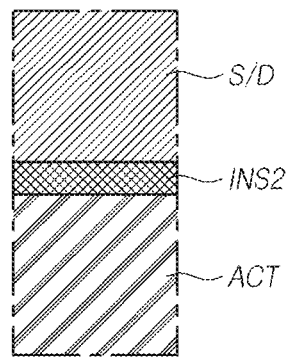
FIG. 7 is a diagram illustrating a contact area in an AES structure transistor according to embodiments of the present disclosure.
Figure 8:
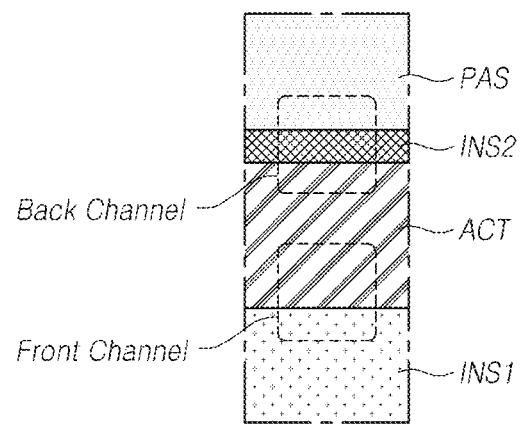
FIG. 8 is a diagram illustrating a channel region in an AES structure transistor according to embodiments of the present disclosure.

FIG. 6 illustrates the transistor (TR) of an AES (Advanced Etch Stopper) structure according to an embodiment of the present disclosure, FIG. 7 illustrates the contact area (CA) of the AES structure transistor according to the embodiment of the present disclosure, and FIG. 8 illustrates the channel area (CHA) in the AES structure transistor according to the embodiment of the present disclosure.

With reference to FIG. 6, the transistor (TR) of an AES (Advanced Etch Stopper) structure disposed on a panel (PNL) may include an active layer (ACT), a source electrode (S), a drain electrode (D), a gate electrode (GATE) and the like. A first insulation film (INS1) is disposed on a substrate (SUB). The active layer (ACT) is disposed on the first insulation film (INS1).

The second insulation film (INS2) is disposed on the active layer (ACT) and the first insulation film (INS1) and covers the active layer (ACT). The second insulation film (INS2) may have a thickness smaller than the thickness of the first insulation film (INS1).

The source electrode (S) and the drain electrode (D) may be disposed apart from each other on the second insulation film (INS2). Thus, the source electrode (S) and the drain electrode (D) may be separated from the active layer (ACT) by the second insulation film (INS2).

That is, the source electrode (S) is disposed on the second insulation film (INS2) and may be overlapped with one end of the active layer (ACT) while being spaced apart from the active layer (ACT). The drain electrode (D) is disposed on the second insulation film (INS2) and may be overlapped with the other end of the active layer (ACT) while being spaced apart from the active layer (ACT).

The transistor (TR) of the AES structure according to embodiments of the present disclosure may have the bottom gate structure or the top gate structure.

With reference to to FIG. 6 to FIG. 8, the transistor (TR) of the bottom gate structure may be described as an example. Therefore, the gate electrode (GATE) may be positioned between the substrate (SUB) and the first insulation film (INS1). In this case, the first insulation film (INS1) may correspond to a gate insulation film or a gate insulator.

The first insulation film (INS1) may be disposed over the entire active area (A/A) of the panel (PNL). In some cases, the first insulation film (INS1) may extend to the non-active area (N/A) of the outer region of the active area (A/A).

The first insulation film (INS1) may be an insulating layer entirely deposited on the surface. That is, the first insulation film (INS1) may be a thin film formed by performing full-surface deposition or entire deposition without a mask process.

In the electronic device according to embodiments of the present disclosure, the second insulation film (INS2) may be disposed over the entire active area (A/A) of the panel (PNL). In some cases, the second insulation film (INS2) may extend to the non-active area (N/A), which is an outer region of the active area (A/A).

In the electronic device according to embodiments of the present disclosure, the second insulation film (INS2) may be a thin insulator layer. That is, the second insulation film (INS2) may be a thin film formed by performing a full-surface deposition or entire deposition without a mask process.

In the electronic device according to embodiments of the present disclosure, the second insulation film (INS2) may be formed by a thin film deposition process capable of controlling thin film deposition such as MOCVD (Metal Organic Chemical Vapor Deposition) or ALD (Atomic Layer Deposition). MOCVD (Metal-Organic Chemical Vapor Deposition) process is a type of CVD (Chemical Vapor Deposition) in which a raw material gas flows out on a high temperature substrate to cause a decomposition reaction on the surface to form a thin film. That is, this is a technique in which an organic metal complex is contained in a raw material gas, and the organic metal gas is pyrolyzed on the heated substrate to grow a semiconductor thin film. In the case of the MOCVD method, it may be possible to operate a film at a lower temperature than that of the CVD using a halogenide halide gas, and to obtain a uniform film capable of controlling thin films at the atomic unit.

The ALD (Atomic Layer Deposition) process is a deposition method in which particles formed by a chemical reaction between reactive gases are deposited on the surface of the substrate to form a thin film by separating and supplying the respective reaction materials. In this method, after one chemical reaction material is chemically adsorbed on the substrate on which the thin film is to be deposited, a second or third gas is introduced and chemicaly absorbed and thereby thin film is deposited on the substrate.

In the case that such an MOCVD or ALD method is utilized, although the productivity and growth rate of the thin film may be somewhat reduced, the thin film deposition performance may be enhanced in comparison with the general PVD (Physical Vapor Deposition) and other general CVD (Chemical Vapor Deposition), and thereby the fine control of thin film thickness may be possible. That is, in the case of MOCVD or ALD process, a thin film having excellent step coverage characteristics may be formed.

In addition, in the case that such an MOCVD or ALD method is utilized, the thin film having a higher uniformity of thickness and higher composition uniformity and a higher density may be formed in comparison with other general vapor deposition methods such as sputtering.

The second insulation film (INS2) formed by the MOCVD or ALD method may be a very thin insulating layer. In addition, in the second insulation film (INS2) formed by the MOCVD or ALD method, the thickness variation by position may be very small. That is, the second insulation film (INS2) may have a high thickness uniformity.

Furthermore, the second insulation film (INS2) formed by the MOCVD or ALD method may be a high-density insulating film.

Meanwhile, the first insulation film (INS1) may be formed by the thin film deposition method such as MOCVD or ALD process used to form the second insulation film (INS2). Alternatevely, the first insulation film (INS1) may be formed by using other general CVD or PVD except thin film deposition techniques such as MOCVD or ALD.

In the electronic device according to embodiments of the present disclosure, even if the first insulation film (INS1) is formed by the thin film deposition method such as MOCVD or ALD for forming the second insulation film (INS2), the first insulation film (INS1) may be formed thicker than the second insulation film (INS2).

In the case that the second insulation film (INS2) is formed by the thin film deposition method such as MOCVD or ALD and the first insulation film (INS1) is formed by another deposition method, the second insulation film (INS2) may be thinner than the first insulation film (INS1).

In the case that the second insulation film (INS2) is formed by the thin film deposition method such as MOCVD or ALD and the first insulation film (INS1) is formed by another deposition method, the second insulation film (INS2) may have a smaller thickness deviation than the first insulation film (INS1). That is, the second insulation film (INS2) may have a better thickness uniformity than the first insulation film (INS1).

In the case that the second insulation film (INS2) is formed by the thin film deposition method such as MOCVD or ALD and the first insulation film (INS1) is formed by another deposition method, the second insulation film (INS2) may have a higher density than the first insulation film (INS1).

The first insulation film (INS1) may include at least one of SiOx, SiO2, TiOx, SiON, SiNx and the like, and the second insulation film (INS2) may include at least one of SiOx, SiO2, TiOx, SiON, SiNx and the like. In some embodiments, the first insulation film (INS1) and the second insulation film (INS2) may be made of the same material. For example, the first insulation film (INS1) and the second insulation film (INS2) may be formed of SiO2. As another example, the first insulation film (INS1) and the second insulation film (INS2) may be all made of SiOx.

In other embodiments, the first insulation film (INS1) and the second insulation film (INS2) may be formed of different materials. For example, the first insulation film (INS1) may be made of SiO2 and the second insulation film (INS2) may be made of SiON. Alternatively, the first insulation film (INS1) and the second insulation film (INS2) may be formed of an oxide insulating film containing oxygen.

In the case that the first insulation film (INS1) and the second insulation film (INS2) are oxide insulating films, the oxygen content of the second insulation film (INS2) may be different from the oxygen content of the first insulation film (INS1). For example, the oxygen content of the second insulation film (INS2) may be higher than the oxygen content of the first insulation film (INS1).

In addition, the first insulation film (INS1) and the second insulation film (INS2) may be composed of insulating film that commonly includes a material other than oxygen (e.g., SiNx). In this case, the common material content (e.g., N) of the second insulation film (INS2) may be different from the common material content (e.g., N) of the first insulation film (INS1).

Meanwhile, the active layer (ACT) of the transistor (TR) of the AES (Advanced Etch Stopper) structure according to embodiments of the present disclosure may be various types. For example, the active layer (ACT) may be formed of an amorphous silicon (a-Si) semiconductor. The transistor (TR) including such an active layer (ACT) may be referred to as an amorphous silicon (a-Si) transistor.

In another example, the active layer (ACT) may be made of a poly-silicon semiconductor. The transistor (TR) including this active layer (ACT) may be referred to as the LTPS (Low-Temperature Polycrystalline Silicon) transistor.

In another example, the active layer (ACT) may be made of an oxide semiconductor. The transistor (TR) including this active layer (ACT) may be referred to as the oxide transistor. In this case, for example, the oxide semiconductor may be an N-type oxide semiconductor such as IGZO, IZO or ITZO, or a P-type oxide semiconductor such as $CuO_x$, $SnO_x$, or $NiO_x$.

With reference to FIGS. 7 and 8, the contact area (CTA) and the channel area (CHA) of FIG. 6 will be described. Hereinafter, it is assumed for purposes of description that a passivation layer (PAS) is disposed on the source electrode (S) and the drain electrode (D).

With reference to FIG. 7, the contact area (CTA) may be a region in which the source electrode (S) and the active layer (ACT) are in contact with each other by the MIS (Metal Insulator Semiconductor) contact principle, and the drain electrode (D) and the active layer ACT are contacted by the MIS (Metal Insulator Semiconductor) contact principle.

As illustrated in FIG. 7, the second insulation film (INS2) is disposed between the source electrode (S) and the active layer (ACT). Furthermore, the second insulation film (INS2) is disposed between the drain electrode (D) and the active layer (ACT).

Although the second insulation film (INS2) is disposed between the source electrode (S) and the active layer (ACT), the second insulation film (INK) is formed to be very thin through, e.g., MOCVD or ALD thin film deposition techniques, and therefore the contact resistance between the source electrode (S) and the active layer (ACT) may be lowered by the MIS (Metal Insulator Semiconductor) contact principle.

Similarly, though the second insulation film (INS2) is disposed between the drain electrode (D) and the active layer (ACT), because the second insulation film (INS2) is formed to be very thin, the contact resistance between the drain electrode (D) and the active layer (ACT) may be lowered according to the MIS contact principle.

With reference to FIG. 8, the channel area (CHA) may be the region where the channel is formed in the active layer (ACT) when the gate voltage of a turn-on level is applied to the gate electrode (GAIL). The channel may include the back channel adjacent to the source electrode (S) and the drain electrode (D), and the front channel far from the source electrode (S) and the drain electrode (D).

Figure 9:
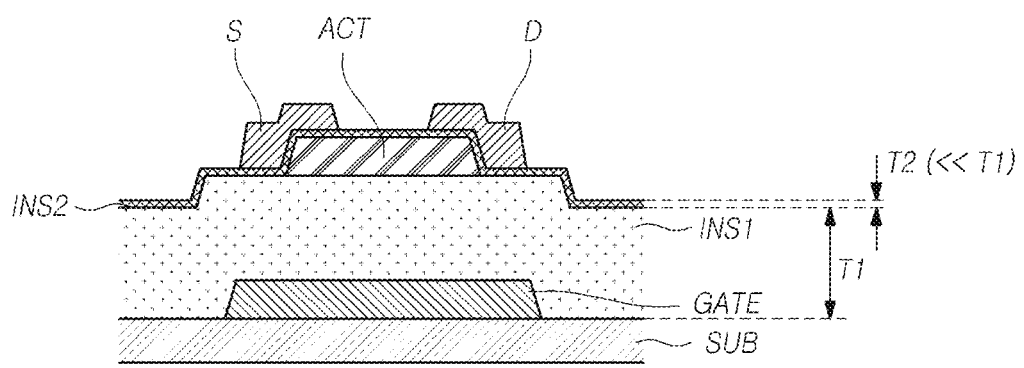
FIG. 9 is a diagram for explaining characteristics of an AES structure transistor according to embodiments of the present disclosure.
Figure 10:
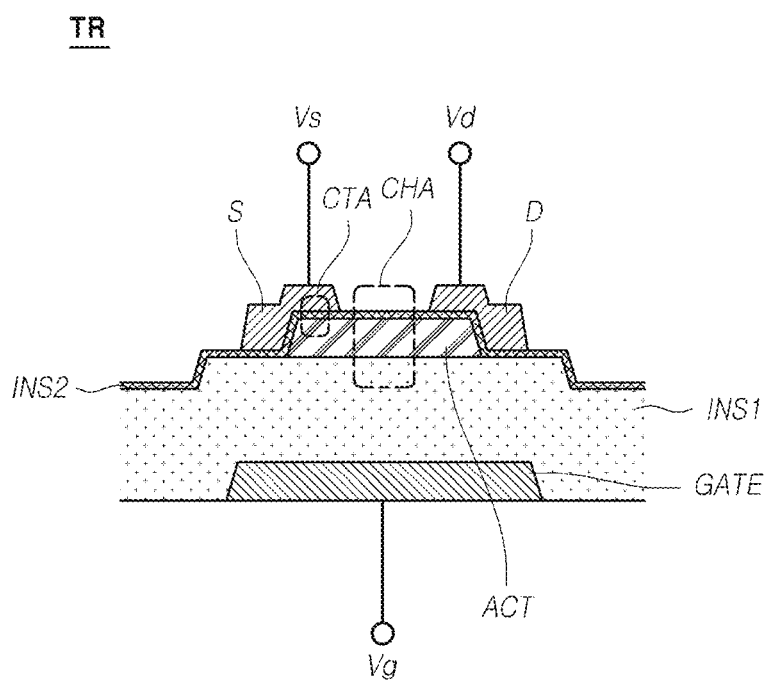
FIG. 10 is a diagram for explaining an operation of an AES structure transistor according to the embodiments of the present disclosure.

FIG. 9 is a diagram for explaining characteristics of the AES structure transistor (TR) having the AES structure according to an embodiment of the present disclosure, and FIG. 10 is a diagram for explaining the operation or operation principle of the AES structure transistor according to embodiments of the present disclosure.

With reference to FIG. 9, the active layer (ACT) is separated from the source electrode (S) and the drain electrode (D) by the second insulation film (INS2). This structure may prevent the back channel of the active layer (ACT) from being damaged during the panel manufacturing process. That is, when an etching process for forming the source electrode (S) and the drain electrode (D) is performed during the panel manufacturing process, the channel area (back channel area) of the active layer (ACT) may be protected without being etched because of the second insulation film (INS2) stacked on the active layer (ACT). That is, the second insulation film (INS2) may serve as an etch stopper (ES) for preventing damage to the channel of the active layer (ACT).

Meanwhile, as described above, the second insulation film (INS2) may be formed to have a very thin thickness (T2) because the second insulation film (INS2) is formed by the thin film deposition method such as MOCVD or ALD process capable of controlling the thin film deposition.

In the case that the second insulation film (INS2) is formed by the thin film deposition method such as MOCVD or ALD and the first insulation film (INS1) is formed by another deposition method, the thickness (T2) of the second insulation film (INS2) may be much thinner than the thickness (T1) of the first insulation film.

As a result, because the second insulation film (INS2) disposed between the source/drain electrode (S/D) and the active layer (ACT) is very thin, the second insulation film (INS2) may not have complete insulation characteristics, and thereby the contact resistance between the source/drain electrode (S/D) and the active layer (ACT) may be reduced.

As described above, in the case that the second insulation film (INS2) is formed by the thin film deposition method such as MOCVD or ALD and the first insulation film (INS1) is formed by another deposition method, the thickness (T2) of the second insulation film (INS2) may be smaller than the thickness (T1) of the first insulation film (INS1). That is, the second insulation film (INS2) may be a thin insulator layer.

For example, the second insulation film (INS2) may have a thickness (T2) of 50 Å or less. In some cases, the second insulation film (INS2) may have a thickness (T2) within a range of 10 Å to 20 Å, or a thickness (T2) of 10 Å or less. In consideration of the role of the second insulation film (INS2) to be described later, if the thickness (T2) of the second insulation film (INS2) exceeds a threshold thickness (for example, 10, 20 or 50 Å) depending on the specific conditions (e.g., oxygen content), the second insulation film (INS2) may not be capable of transferring carriers between the source/drain electrodes (S/D) and the active layer (ACT). In this case, the transistor (TR) may not operate normally.

Meanwhile, the thickness (T2) of the second insulation film (INS2) may vary depending on the oxygen content of the second insulation film (INS2). In addtion, the thickness (T2) of the second insulation film (INS2) may vary depending on the oxygen content difference between the first insulation film (INS1) and the second insulation film (INS2). As the oxygen content (A) of the second insulation film (INS2) is larger than the oxygen content (B) of the first insulation film (INS1), the second insulation film (INS2) may be formed thicker.

For example, when the oxygen content of the second insulation film (INS2) is higher than the oxygen content of the first insulation film (INS1) by a first amount, the thickness (T2) of the second insulation film (INS2) may be designed to have a thickness (T2) of 10-20 Å. In the case that the oxygen content of the second insulation film (INS2) is larger than the oxygen content of the first insulation film (INS1) by a second amount (the second amount is higher than the first amount, and represents a over oxygen content state), the thickness (T2) of the second insulation film (INS2) may be designed to have a thickness of about 50 Å.

With reference to FIG. 10, the gate voltage (Vg), the source voltage (Vs), and the drain voltage (Vd) may be applied to the gate electrode (G), the source electrode (S)

and the drain electrode (D) of the transistor (TR) of the AES structure, respectively. The operation principle of the AES structure transistor (TR) with the AES structure will be described below under the voltage application condition for turning on the transistor (TR).

As described above, a defect may occur in the first insulation film (INS1) and/or the second insulation film (INS2) due to the oxygen content difference (or the difference in common material content such as nitrogen N) between the first insulation film (INS1) and the second insulation film (INS2). For example, if the oxygen content of the second insulation film (INS2) is higher than the oxygen content of the first insulation film (INS1), defects may be induced and occur in the second insulation film (INS2). Thus, the carriers such as electrons and holes transferred from the source electrode (S) and the drain electrode (D) may be trapped in the second insulation film (INS2).

The second insulation film (INS2) may have a thickness equal to or less than a predetermined thickness threshold value. Here, the thickness threshold value may be in the range of 10 to 20 Å, and when the second insulation film (INS2) is in the over oxygen content state, the thickness threshold value may be 50 Å or a value close thereto.

As described above, because the thickness (T2) of the second insulation film (INS2) may be extremely small, the carriers, such as electrons, holes and the like, trapped in the second insulation film (INS2) from the source electrode (S) and the drain electrode (D) may be transferred to the active layer (ACT). Therefore, the channel may be formed in the active layer (ACT) and the current may flow through the transistor (TR).

The thickness (T2) of the second insulation film (INS2) may be set in order that the carriers, such as electrons and holes, trapped in the second insulation film (INS2) from the source electrode (S) and the drain electrode (D) may be delivered to the active layer (ACT).

As described above, in the transistor (TR) of the AES structure according to embodiments of the present disclosure, although the source/drain electrode (S/D) and the active layer (ACT) are separated by the second insulation film (INS2), it may be possible to perform a normal operation by designing a configuration satisfying the following example conditions: (1) a condition in which the second insulation film (INS2) is formed thin by a thin film deposition process such as MOCVD or ALD; and (2) a condition in which defects are induced in the second insullation film (INS2) due to a difference in common material content (for example, oxygen content difference) between the first insulation film (INS1) and the second insulation film (INS2), thereby causing the carriers such as electrons and holes to be trapped in the second insulation film (INS2).

As described above, in the transistor (TR) of the AES structure according to embodiments of the present disclosure, the second insulation film (INS2) existing between the source/drain electrode (S/D) and the active layer (ACT) may serve not only as an etch stopper (ES) for preventing back channel damage of the active layer (ACT), but also as a transfer medium of the carriers (electrons and holes, etc.) enabling the normal operation of the transistor (TR). In this sense, the transistor (TR) according to embodiments of the present disclosure may be expressed to have an AES (Advanced Etch Stopper) structure.

The transistor (TR) of the AES structure according to embodiments of the present disclosure may have a bottom gate structure or a top gate structure. In the transistor (TR) of the AES structure according to embodiments of the present disclosure, the AES structure transistor (TR) having the top gate structure and the AES structure transistor (TR) having the bottom gate structure may be different only in the position of the gate electrode (GATE), and all remaining features, structures and operating principles may be the same.

Hereinafter, the transistor (TR') having the AES structure having the top gate structure will be described, with a focus only on the differences from the above-described bottom gate structure.

Figure 11:
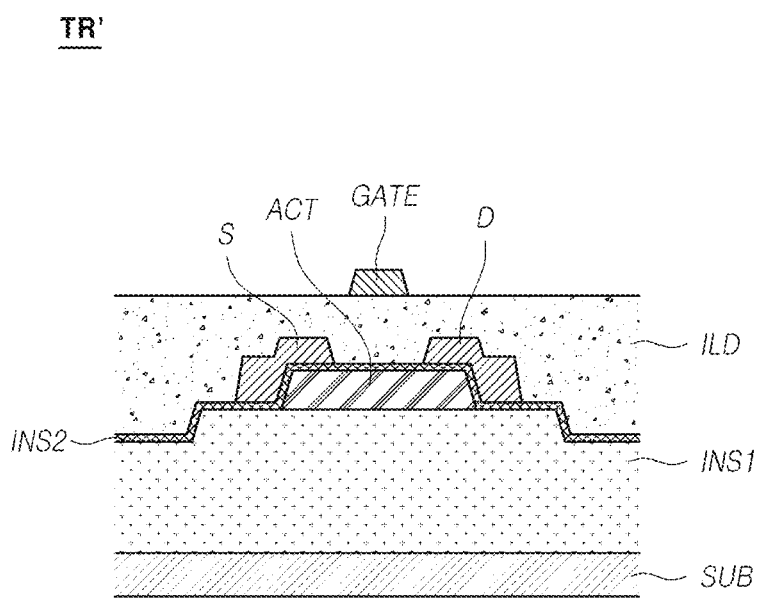
FIG. 11 is a diagram illustrating an AES structure transistor with a top gate structure according to embodiments of the present disclosure.

FIG. 11 illustrates the AES structure transistor (TR') having a top gate structure according to embodiments of the present disclosure. With reference to FIG. 11, the AES structure transistor (TR') having the top gate structure according to embodiments of the present disclosure may includes the third insulation film (ILD) disposed to cover the source electrode (S) and the drain electrode (D). The gate electrode (GATE) may be disposed on the third insulation film (ILD).

The switching transistor (O-SWT) in each subpixel (SP) in the active area (A/A) of the panel (PNL) for the OLED panel as shown in FIG. 3, and the transistors (Tup, Tdown, transistors in the CSC) in each gate drive circuit (GDC) of the GIP type in the non-active area (N/A) of the panel (PNL) for the OLED panel or the LCD panel as shown in FIG. 5, may be implemented with the transistors (TR, TR') as shown in FIG. 6 or FIG. 11. Also, the driving transistor (DRT) in each subpixel (SP) in the active area (A/A) of the panel (PNL) for the OLED panel as shown in FIG. 3, and the switching transistor (L-SWT) in each subpixel (SP) in the active area (A/A) of the panel (PNL) for the LCD panel as shown in FIG. 4, may also be implemented with the transistors (TR, TR') as shown in FIG. 6 or FIG. 11.

However, there may be further provided a structure in which the source electrode (S) or the drain electrode (D) is connected to the pixel electrode (PXL). The connection structure of such a pixel electrode (PXL) will be described below. Hereinafter, for convenience of explanation, it may be assumed that the drain electrode (D) is connected to the pixel electrode (PXL). However, depending on the circuit design, the source electrode (S) may be connected to the pixel electrode (PXL).

Figure 12:
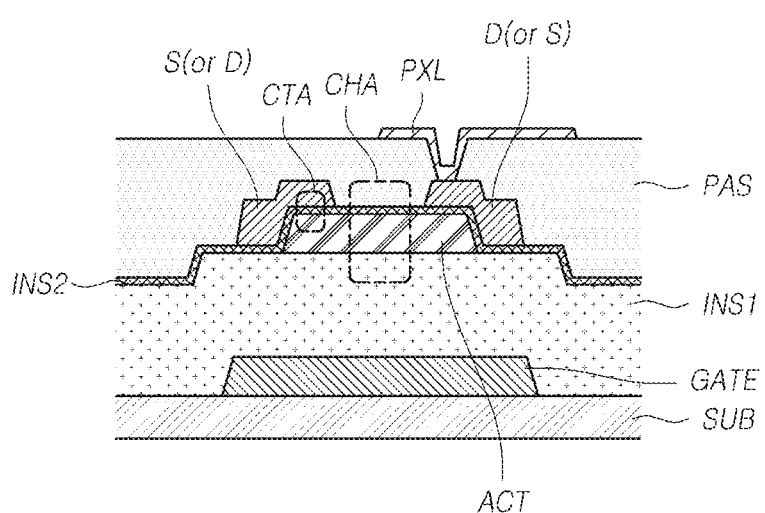
FIG. 12 is a diagram illustrating an AES structure transistor connected to a pixel electrode in the case that the AES structure transistor according to embodiments of the present disclosure is disposed in a subpixel.

FIG. 12 is a diagram illustrating an AES structure transistor (TR) connected to the pixel electrode (PXL) when the AES structure transistor TR according to embodiments of the present disclosure is disposed in a subpixel (SP). With reference to FIG. 12, among the AES structure transistors (TR) having a bottom gate structure that are disposed in the subpixel (SP) in the active area (A/A), there may be provided transistors (DRT, L-SWT) in which the drain electrode (D) is connected to the pixel electrode (PXL).

The passivation layer (PAS) may be disposed to cover the source electrode (S) and the drain electrode (D) of the transistor (TR). The pixel electrode (PXL) may be positioned on the passivation layer (PAS), and the pixel electrode (PXL) may be electrically connected to the source electrode (S) or the drain electrode (D) through a hole formed in the passivation layer (PAS).

In the case that the panel (PNL) is an OLED panel, because the transistor (TR) to be electrically connected to the pixel electrode (PXL) is the driving transistor (DRT) shown in FIG. 3, the data voltage may be applied to the gate electrode (GAIL). Meanwhile, in the case that the panel (PNL) is an LCD panel, because the transistor (TR) to be electrically connected to the pixel electrode (PXL) is the switching transistor (L-SWT) electrically connected between the data line (DL) and the pixel electrode (PXL), the data voltage may be applied to the pixel electrode (PXL).

Figure 13:
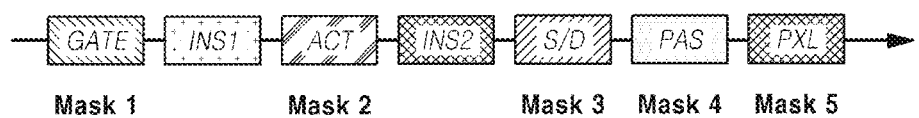
FIG. 13 is a diagram illustrating a process flow of a panel in the case that an AES structure transistor is disposed in a subpixel according to embodiments of the present disclosure.

FIG. 13 is a diagram illustrating a process flow of the panel in the case that the AES structure transistor (TR) is disposed in a subpixel (SP) according to embodiments of the present disclosure. With reference to FIG. 13, in the process of manufacturing the panel (PNL) having the transistor TR of the AES structure according to embodiments of the present disclosure, the first insulation film (INS1) and the second insulation film (INS2) are deposited over the entire substrate without the mask process. Therefore, in the panel manufacturing process, five mask processes may sequentially form (pattern) the gate electrode (GAIL), the active layer (ACT), the source/drain electrode (S/D), the passivation layer (PAS), and the pixel electrode (PXL).

Figure 14:
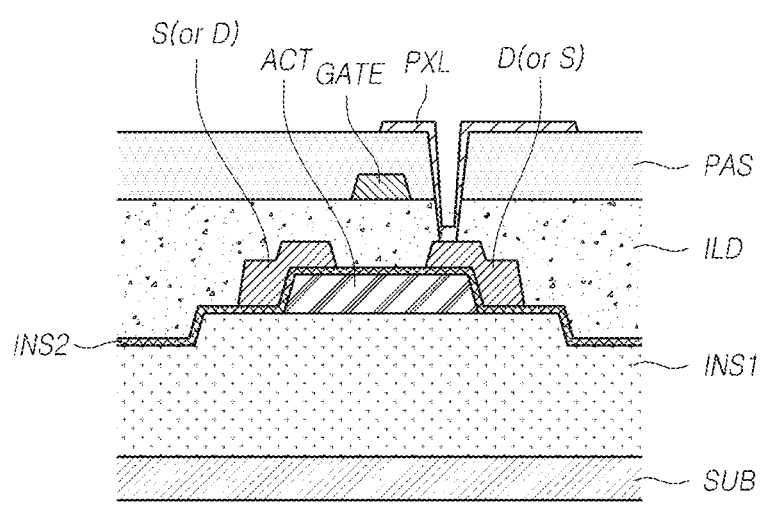
FIG. 14 is a diagram illustrating an AES structure transistor connected to a pixel electrode in the case that an AES structure transistor with a top gate structure according to embodiments of the present disclosure is disposed in a subpixel.

FIG. 14 is a diagram illustrating an AES structure transistor (TR') connected to the pixel electrode (PXL) in the case that the AES structure transistor (TR') with the top gate structure according to embodiments of the present disclosure is disposed in the subpixel (SP). With reference to FIG. 14, among transistors (TR') of the AES structure having the top gate structure disposed in the subpixel (SP) in the active area (A/A), there may be provided transistors (DRT, L-SWT) in which the drain electrode (D) is connected to the pixel electrode (PXL).

The passivation layer (PAS) may be disposed to cover the gate electrode (GAIL) of this transistor (TR'). The pixel electrode (PXL) may be positioned on the passivation layer (PAS). The pixel electrode (PXL) may be electrically connected to the source electrode (S) or the drain electrode (D) through a hole formed in the passivation layer (PAS) and the third insulation film (ILD).

Figure 15:
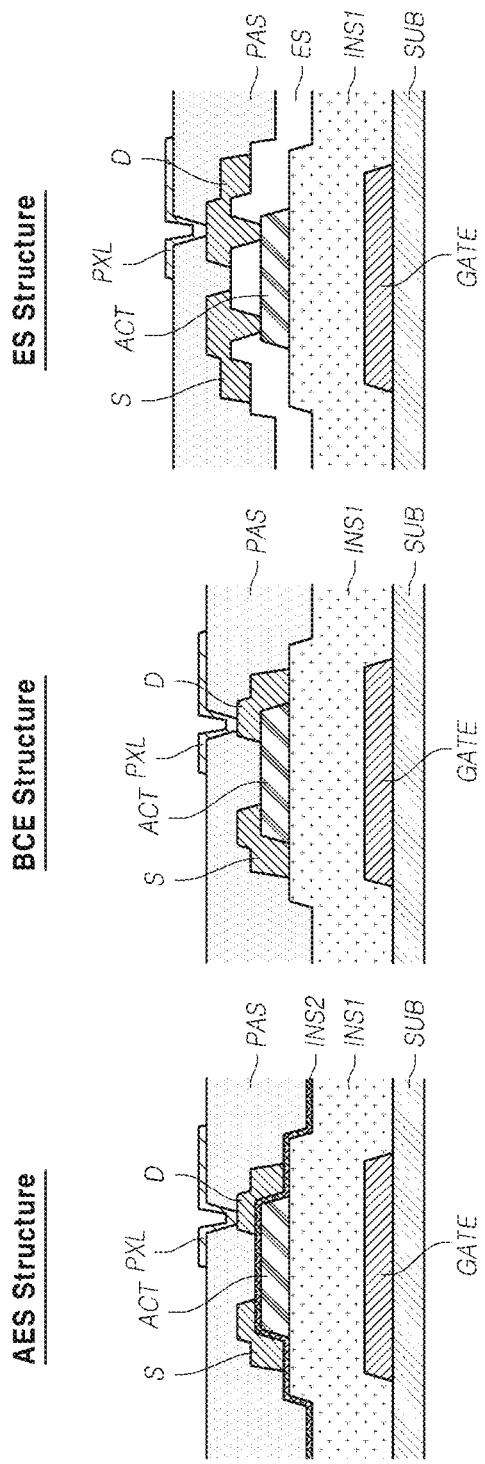
FIG. 15 is a diagram for explaining a comparison between an AES structure transistor according to embodiments of the present disclosure, a BCE structure transistor and an ES structure transistor.

FIG. 15 is a diagram for explaining a comparison between the AES structure transistor (TR) according to embodiments of the present disclosure, a BCE structure transistor, and an ES structure transistor. With reference to FIG. 15, the AES structure transistor (TR) according to embodiments of the present disclosure, and a BCE structure transistor and an ES structure transistor as comparative structures will be briefly described. For convenience of description, a comparison is made based on a bottom gate structure.

With reference to FIG. 15, the BCE structure transistor having a BCE structure may include a gate electrode (GAIL), a source/drain electrode (S/D), and an active layer (ACT). The gate electrode GATE is located on the substrate (SUB). A first insulation film (INS1) corresponding to a gate insulator layer may be disposed on the substrate (SUB) and cover the gate electrode (GAIL). The active layer (ACT) is located on the first insulation film (INS1), and the source/drain electrode (S/D) is located on the active layer (ACT).

The source/drain electrode (S/D) may be spaced apart from each other. The source electrode of the source/drain electrode (S/D) may directly contact one end of the active layer (ACT) or may be contacted through another connection pattern. Similarly, the drain electrode of the source/drain electrode (S/D) may be in direct contact with the other end of the active layer (ACT) or may be contacted through another connection pattern.

The passivation layer (PAS) is disposed on the source/drain electrode (S/D), and the pixel electrode (PXL) is located on the passivation layer (PAS). The pixel electrode (PXL) may be directly connected to the source electrode or the drain electrode among the source/drain electrode (S/D) through the hole in the passivation layer (PAS), or may be contacted through other connection patterns.

In the manufacturing process of the panel including this BCE structure transistor, five mask processes may sequentially form (pattern) the gate electrode (GAIL), the active layer (ACT), the source/drain electrode (S/D), the passivation layer (PAS), and the pixel electrode (PXL). The BCE structure may easily implement a short channel, and may be advantageous for manufacturing a small-sized transistor. Also, the BCE structure may have an advantage that the parasitic capacitances (Cgs, Cgd) between the gate electrode (GAIL) and the source/drain electrode (S/D) are small.

However, in the BCE structure, the channel region (back channel region) of the active layer (ACT) is etched during the etching process for forming the source/drain electrode (S/D), and thereby, the back channel may be damaged. Accordingly, a transistor of this type according to embodiments of the present disclosure may have degraded device performance with regard to threshold voltage, mobility, and reliability.

In summary, the BCE structure has the disadvantage of back channel damage and degraded device performance, but the BCE structure may be advantageous in that the number of mask processes may be reduced to simplify the process, and to implement the short channel and the small-sized transistor.

With reference to FIG. 15, an ES structure transistor having an ES (Etch Stopper) structure may include a gate electrode (GAIL), a source/drain electrode (S/D) and an active layer (ACT), an etch stopper (ES) and the like. The gate electrode (GAIL) is located on the substrate (SUB). A first insulation film (INS1) is disposed on the substrate (SUB) and covers the gate electrode (GAIL). The active layer (ACT) is located on the first insulation film (INS1), and the etch stopper (ES) is disposed on the first insulation film (INS1) and covers the active layer (ACT).

The source/drain electrode (S/D) may be positioned on the etch stopper (ES), and may directly contact the active layer (ACT) through the hole of the etch stopper ES or via another connection pattern. The source/drain electrode (S/D) may be spaced apart from each other. The source electrode of the source/drain electrode (S/D) may directly contact one end of the active layer (ACT) through the first hole in the etch stopper (ES), or may be contacted via another connection pattern. Similarly, the drain electrode of the source/drain electrode (S/D) may be in direct contact with the other end of the active layer (ACT) through the second hole of the etch stopper (ES), or via another connection pattern.

A passivation layer (PAS) is disposed on the source/drain electrode (S/D). The pixel electrode (PXL) is located on the passivation layer (PAS). The pixel electrode (PXL) may directly contact the source electrode or the drain electrode of the source/drain electrode (S/D) through the hole in the passivation layer (PAS), or may be connected to the source electrode or the drain electrode through other connection patterns.

According to this ES structure, because the etch stopper (ES) is formed on the active layer (ACT), the channel region (back channel region) of the active layer (ACT) may be prevented from being etched during the etching process for forming the source/drain electrode (S/D). As a result, the ES structure may provide relatively high transistor performance (threshold voltage, mobility, reliability, etc.).

However, in the manufacturing process of the panel including this ES structure transistor, six mask processes may be required in order to sequentially form the gate electrode (GATE), the active layer (ACT), an etch stopper (ES), the source/drain electrode (S/D), the passivation layer (PAS), and pixel electrode (PXL). That is, the ES structure may require an additional mask process for forming the etch stopper (ES) as compared to the BCE structure.

In addition, the ES structure may have a relatively larger transistor size due to the overlap of the etch stopper (ES) and the source/drain electrode (S/D).

Furthermore, in the case of the ES structure, the source/drain electrode (S/D) on the etch stopper ES is in contact with the active layer (ACT) through the hole in the etch stopper (ES). Therefore, the source/drain electrode (S/D) should be formed to be wide in consideration of the size of the hole of the etch stopper (ES). That is, the area of the the source/drain electrode (S/D) should be increased by the width of the inlet side of the hole of the etch stopper (ES) because the source/drain electrode (S/D) and the active layer (ACT) should be in contact with each other through the hole of the etch stopper (ES). As a result, the ES structure has a disadvantage in that parasitic capacitances (Cgs, Cgd) between the gate electrode (GATE) and the source/drain electrode (S/D) become relatively large.

In summary, the ES structure may make it difficult to implement a short channel and a small transistor, and has a disadvantage of increasing the number of mask processes. However, the ES structure may have an advantage that the back channel damage may be prevented and the transistor performance may be enhanced.

In contrast, in the AES (Advanced ES) structure according to embodiments of the present disclosure, because the second insulation film (INS2) is formed between the active layer ACT and the source/drain electrodes (S/D) through the MOCVD or ALD process, the active layer (ACT) and the source/drain electrode (S/D) may be physically spaced apart from each other by the second insulation film (INS2).

Here, the MOCVD or ALD process may be a method capable of forming a thin film having excellent step coverage characteristics and higher density, and being superior in thickness uniformity and composition uniformity to other general deposition methods.

In the manufacturing process of the panel including the AES structure transistor (TR) according to embodiments of the present disclosure, it may not be required to form the etch stopper (ES) structure, and thereby the number of mask processes may be reduced.

In addition, the AES structure according to embodiments of the present disclosure may have an advantage in that back channel damage may be prevented and excellent transistor performance (threshold voltage, mobility, reliability, etc.) may be obtained by separating the active layer (ACT) and the source/drain electrodes (S/D) from each other through the second insulation film (INS2) having a specific characteristic without forming an etch stopper (ES) structure.

Here, the specific characteristic of the second insulation film (INS2) may include good step coverage, a thin thickness, a difference in common material content (e.g., oxygen content difference) with the first insulation film (INS1) and the like.

In addition, the AES structure according to embodiments of the present disclosure may have the advantage that the short channel structure and small-size transistor may be easily implemented by forming the channel by utilizing the structural characteristics (the thin thickness, the high step coverage, the high oxygen content) of the second insulation film (INS2).

In the case of the AES structure according to embodiments of the present disclosure, the source/drain electrode (S/D) and the active layer (ACT) may not need to be connected through the holes of the etch stopper (ES), and the source/drain electrode (S/D) and the active layer (ACT) may be physically separated from each other. Therefore, it may not be necessary to form the source/drain electrode (S/D) with a large area in consideration of the size (entrance width) of the hole of the etch stopper (ES), as in the ES structure. As a result, the parasitic capacitances (Cgs, Cgd) between the source/drain electrodes (S/D) and the gate electrode (GATE) may be reduced and possibly minimized, and the reliability of the transistor may be enhanced.

In addition, the AES (Advanced ES) structure according to embodiments of the present disclosure may have all the advantages of each of the BCE structure and the ES structure described above by selecting the structural characteristic (thickness, common material content difference with the first insulation film and the like) of the second insulation film (INK).

It will be apparent to those skilled in the art that various modifications and variations can be made in the transistor and electronic device of the present disclosure without departing from the spirit or scope of the disclosure. Thus, it is intended that the present disclosure cover the modifications and variations of this disclosure provided they come within the scope of the appended claims and their equivalents.

What is claimed is:

1. An electronic device, comprising:
   a panel;
   a driving circuit configured to drive the panel; and
   a transistor disposed in the panel, the transistor including:
      a first insulation film on a substrate;
      an active layer disposed on the first insulation film;
      a second insulation film disposed on the active layer and the first insulation film to cover the active layer, the second insulation film having a thickness smaller than a thickness of the first insulation film;
      a source electrode disposed on the second insulation film and spaced apart from the active layer by the second insulation film, the source electrode overlapping an end of the active layer; and
      a drain electrode disposed on the second insulation film and spaced apart from the active layer by the second insulation film, the drain electrode overlapping another end of the active layer,
   wherein the transistor includes a contact region,
   wherein the contact region includes a region in which:
      a portion of an upper surface of the active layer, a portion of a side surface of the active layer, the second insulation film, and the source electrode overlap each other, and
      another portion of the upper surface of the active layer, a portion of a side surface of the active layer, the second insulation film, and the drain electrode overlap each other,
   wherein the contact region is a region in which carriers are to be transferred between the active layer and the source electrode and between the active layer and the drain electrode, and
   wherein the thickness of the second insulation film is 10 Å or less.

2. The electronic device of claim 1, wherein a gate electrode is disposed between the substrate and the first insulation film.

3. The electronic device of claim 2, wherein:
   the transistor is disposed in an active area of the panel;
   a passivation layer is disposed to cover the source electrode and the drain electrode;
   a pixel electrode is disposed on the passivation layer; and
   the pixel electrode is electrically connected to the source electrode or the drain electrode through a hole in the passivation layer.

4. The electronic device of claim 3, wherein a data voltage is applied to the gate electrode.

5. The electronic device of claim 3, wherein a data voltage is applied to the pixel electrode.

6. The electronic device of claim 1, wherein the active layer is composed of an amorphous silicon semiconductor.

7. The electronic device of claim 1, wherein the active layer is composed of a poly-silicon semiconductor.

8. The electronic device of claim 1, wherein the active layer is composed of an oxide semiconductor.

9. The electronic device of claim 1, wherein the first insulation film and the second insulation film are made of a same material.

10. The electronic device of claim 1, wherein the first insulation film and the second insulation film are made of different materials.

11. The electronic device of claim 1, wherein:
the first insulation film and the second insulation film are formed of an oxide insulation film; and
an oxygen content of the second insulation film is higher than an oxygen content of the first insulation film.

12. The electronic device of claim 1, wherein the second insulation film has a smaller thickness deviation than the first insulation film.

13. The electronic device of claim 1, wherein the second insulation film has a higher density than the first insulation film.

14. The electronic device of claim 1, wherein the second insulation film extends to a non-active area outside of an active area of the panel.

15. The electronic device of claim 1, wherein the transistor is disposed in an area of each of a plurality of subpixels in an active area of the panel.

16. The electronic device of claim 1, wherein the transistor is disposed in a non-active area outside of an active area of the panel.

17. The electronic device of claim 1, wherein:
a third insulation film is disposed to cover the source electrode and the drain electrode; and
a gate electrode is disposed on the third insulation film.

18. The electronic device of claim 17, wherein:
the transistor is disposed in an active area of the panel;
a passivation layer is disposed to cover the gate electrode;
a pixel electrode is disposed on the passivation layer; and
the pixel electrode is electrically connected to the source electrode or the drain electrode through a hole in the passivation layer and the third insulation film.

19. The electronic device of claim 1, wherein when the second insulation film is formed by a MOCVD (Metal-Organic Chemical Vapor Deposition) method or a ALD (Atomic Layer Deposition) method.

20. A transistor, comprising:
a first insulation film on a substrate;
an active layer disposed on the first insulation film;
a second insulation film disposed on the active layer and the first insulation film to cover the active layer, the second insulation film having a thickness smaller than a thickness of the first insulation film;
a source electrode disposed on the second insulation film and spaced apart from the active layer by the second insulation film, the source electrode overlapping an end of the active layer; and
a drain electrode disposed on the second insulation film and spaced apart from the active layer by the second insulation film, the drain electrode overlapping another end of the active layer,
wherein the transistor includes a contact region,
wherein the contact region includes a region in which:
a portion of an upper surface of the active layer, a portion of a side surface of the active layer, the second insulation film, and the source electrode overlap each other, and
another portion of the upper surface of the active layer, a portion of a side surface of the active layer, the second insulation film, and the drain electrode overlap each other,
wherein the contact region is a region in which carriers are to be transferred between the active layer and the source electrode, and between the active layer and the drain electrode, and
wherein the thickness of the second insulation film is 10 Å or less.

21. The transistor of claim 20, wherein:
the first insulation film and the second insulation film include a common material; and
the second insulation film is made of a material having more common material content than the first insulation film.

22. An electronic device, comprising:
a panel;
a driving circuit configured to drive the panel; and
a transistor disposed in the panel, the transistor including:
a first insulation film on a substrate;
an active layer disposed on the first insulation film;
a second insulation film disposed on the active layer and the first insulation film to cover the active layer, the second insulation film having a thickness smaller than a thickness of the first insulation film;
a source electrode disposed on the second insulation film and spaced apart from the active layer by the second insulation film, the source electrode overlapping an end of the active layer;
a drain electrode disposed on the second insulation film and spaced apart from the active layer by the second insulation film, the drain electrode overlapping another end of the active layer; and
a pixel electrode directly contacting one of the source electrode and the drain electrode,
wherein the transistor includes a contact region,
wherein the contact region includes a region in which:
a portion of an upper surface of the active layer, a portion of a side surface of the active layer, the second insulation film, and the source electrode overlap each other, and
another portion of the upper surface of the active layer, a portion of a side surface of the active layer, the second insulation film, and the drain electrode overlap each other,
wherein the contact region is a region in which carriers are to be transferred between the active layer and the source electrode and between the active layer and the drain electrode,
wherein all of a contacting surface of the pixel electrode that directly contacts the source electrode or the drain electrode is over the active layer, and
wherein the thickness of the second insulation film is 10Å or less.

* * * * *